United States Patent [19]
Jang et al.

[11] Patent Number: 5,896,324
[45] Date of Patent: Apr. 20, 1999

[54] OVERVOLTAGE DETECTION CIRCUIT FOR GENERATING A DIGITAL SIGNAL FOR A SEMICONDUCTOR MEMORY DEVICE IN PARALLEL TEST MODE

[75] Inventors: Tae-sung Jang, Suwon; Chan-jong Park, Seoul, both of Rep. of Korea

[73] Assignee: Samsung Electronics, Co., Ltd., Suwon, Rep. of Korea

[21] Appl. No.: 08/862,828

[22] Filed: May 23, 1997

[30] Foreign Application Priority Data

Aug. 20, 1996 [KR] Rep. of Korea ............ 96-34507

[51] Int. Cl.$^6$ ............................................. G11C 16/04
[52] U.S. Cl. .................. 365/189.07; 365/201; 365/241; 365/7
[58] Field of Search ................... 365/189.07, 201, 365/191, 241, 189.09, 7; 307/296.03, 296.6

[56] References Cited

U.S. PATENT DOCUMENTS 5,063,304  11/1991  Iyengar ................... 307/296.6
5,300,824  4/1994  Iyengar .................... 307/296.3

Primary Examiner—David Nelms
Assistant Examiner—Thong Le
Attorney, Agent, or Firm—Marger Johnson. & McCollom P.C.

[57] ABSTRACT

A method for detecting an overvoltage signal applied to a semiconductor memory device address pin reduces stress on the device and simplifies the testing process by dividing the voltage of the overvoltage signal and comparing it to a reference voltage, thereby generating a difference signal. The difference signal is buffered by a drive stage which generates a test mode output signal that places the memory device in a test mode. An overvoltage detection circuit for implementing this method includes a comparison signal generator having a resistive voltage divider for dividing the overvoltage signal and generating a comparison signal. A differential amplifier compares the comparison signal to a reference signal from a reference signal generator. The differential amplifier generates a difference signal which is coupled to a drive stage which generates a test mode output signal. The comparison signal generator, the differential amplifier, and the drive stage can be enabled in response to a test mode enable signal.

17 Claims, 2 Drawing Sheets

OVERVOLTAGE DETECTION CIRCUIT FOR GENERATING A DIGITAL SIGNAL FOR A SEMICONDUCTOR MEMORY DEVICE IN PARALLEL TEST MODE

BACKGROUND OF THE INVENTION

The present invention relates to semiconductor memory device testing, and more particularly, to a method and apparatus for detecting an overvoltage signal applied to a memory device input pin.

Advances in manufacturing processes and device design have led to improved semiconductor memory devices. Process advances have resulted in highly integrated devices which can store a large amount of information in a small area. Design advances have improved the access speed and power consumption of semiconductor memory devices, as well as the techniques by which the characteristics of a memory device are verified and analyzed. These advances have been especially noteworthy in the area of dynamic random access memory (DRAM).

In a DRAM semiconductor device, an address signal, which is normally used for selecting a specific memory cell, is used in conjunction with control signals /RAS (row address strobe), /CAS (column address strobe), and /W (write) to control read, write, refresh, and test mode operations. However, due to the limited number of control signals that are available, new test modes such as parallel test mode have been developed.

Timing signals for a parallel test mode operation are shown in FIG. 2. (Address signals have been omitted from FIG. 2.) This timing is commonly referred to as test mode timing. By entering a parallel test mode using the timing sequence shown in FIG. 2, data from more memory cells can be accessed than during a normal read or write operation, and the time required for testing all cells of a DRAM semiconductor device is reduced accordingly. For example, if data from four memory cells is accessed during a normal read or write operation, data from sixteen or more memory cells can be accessed in a parallel test mode.

In a parallel test mode, the data from four or more memory cells is compared internally and accessed through one input/output (I/O) pin. If the data from the four or more memory cells which are being tested in parallel are the same, the output from the I/O pin is "1" (high logic level). If any of the data from the four or more memory cells are different, the output is "0" (low logic level). The output information only indicates whether all of the cells tested in parallel have the same data, but does not indicate what the state of the data is.

To provide more information from a parallel test mode operation, a new method has recently been proposed. According to this new method, a parallel test mode is entered using the timing sequence shown in FIG. 2. If the data from the parallel memory cells are all "1s", a "1" is output through the I/O pin. However, if the data in the memory cells are all "0", a "0" is output through the I/O pin. If the data in any of the memory cells are different, the I/O pin is placed in a high impedance state.

To enter this new parallel test mode, overvoltage signal is applied to a specified address pin in addition to the timing sequence illustrated in FIG. 2. Thus, an overvoltage detection circuit is necessary for sensing the overvoltage signal.

A conventional overvoltage detection circuit for placing a semiconductor memory device in a parallel test mode is shown in FIG. 1. The circuit of FIG. 1 includes three NMOS transistors 11, 13, and 15 connected in series and functioning as a diode to transfer the signal Ai to a node N1. The signal Ai is an address signal during normal operation and an overvoltage signal in test mode. An NMOS transistor 17 is connected between a supply voltage signal VINT and node N1 and functions as a resistor. PMOS transistor 19 is connected between nodes N1 and N2 to transfer the voltage signal from node N1 to node N2. An NMOS transistor 21 has a current path connected between node N2 and a ground terminal and is controlled by a signal VREF applied to its gate. Two series connected inverters 23 and 25 receive the signal from node N2 and generate the signal SVAi.

In operation, when a power supply voltage is applied to the circuit, node N1 is precharged to (VINT−Vtn), where Vtn is the threshold voltage of NMOS transistor 17. NMOS transistor 21 is turned on by the reference voltage VREF, thereby pulling the voltage of node N2 to ground. Since PMOS transistor 19 is off, nodes N1 and N2 are electrically disconnected, and the voltage of node N2 forces the signal SVAi to "0". If the voltage of signal Ai is increased to an overvoltage level, the voltage of node N1 is gradually increased through the three NMOS transistors 11, 13, and 15.

If the voltage of node N1 increases to a level greater than (VINT+Vtp), where Vtp is the threshold voltage of PMOS transistor 19, PMOS transistor 19 turns on thereby causing the voltage of node N2 to increase. If the current flowing from node N1 to N2 through PMOS transistor 19 exceeds the current flowing from node N2 to ground through NMOS transistor 21, the voltage of node N2 increases, and if the voltage at node N2 exceeds the trip point of inverter 23, the signal SVAi switches to "1".

The overvoltage level applied to the input Ai is higher than the supply voltage and is only used to place the semiconductor memory device in test mode. Thereafter, the signal Ai is used as a normal address signal.

When a normal supply voltage level of 5 V is used, an overvoltage level of 7 V is applied to Ai to place the device in test mode. However, during test and development of most semiconductor memory devices, supply voltages which are greater than the normal supply voltage are often used. When a higher supply voltage is used, the overvoltage level must be increased accordingly to cause PMOS transistor 19 to turn on. The voltage of node N1 must be greater than (VINT+Vpt) to cause PMOS transistor 19 to turn on.

When a supply voltage which is greater than 5 V is used, an overvoltage level of greater than 7 V must be applied to pin Ai to place the device in test mode. However, applying a voltage greater than 7 V to an address pin stresses the semiconductor device connected to the pin and can result in damage to the device and an accompanying loss of functionality. Moreover, if the supply voltage is varied, the overvoltage level must be varied accordingly, thereby complicating and adding inconvenience to test mode operation.

SUMMARY OF THE INVENTION

Is therefore an object of the present invention to test a semiconductor memory device using a constant overvoltage signal level regardless of variations in the supply voltage.

A further object of the present invention is to reduce the stress on a semiconductor memory device caused by excessive overvoltage signals in test mode.

To achieve these and other objects, an overvoltage detection circuit in accordance with the preset invention divides the voltage of the overvoltage signal and compares it to a reference voltage signal which is independent of the memory device's internal power supply voltage. The circuit includes a comparison signal generator having a resistive voltage divider for dividing the overvoltage signal and generating a comparison signal. The comparison signal is coupled to a differential amplifier which compares the comparison signal to a reference signal from a reference signal generator. The differential amplifier generates a difference signal which is coupled to a drive stage which generates a test mode output signal. The comparison signal generator, the differential amplifier, and the drive stage can each be enabled by a test mode enable signal.

One aspect of the present invention is an overvoltage detection circuit for testing a semiconductor memory device, the circuit comprising a comparison signal generator for generating a comparison signal responsive to an overvoltage signal, and a differential amplifier coupled to the comparison signal generator for comparing the comparison signal to a reference signal, thereby generating a difference signal. A drive stage is coupled to the differential amplifier for generating an output signal responsive to the difference signal. The comparison signal generator includes a voltage divider coupled to receive the overvoltage signal.

Another aspect of the present invention is a method for detecting an overvoltage signal for testing a semiconductor memory device comprising generating a comparison signal responsive to an overvoltage signal, and comparing the comparison signal to a reference signal, thereby generating a difference signal generating the comparison signal includes dividing the overvoltage signal.

An advantage of the present invention is that it simplifies the signals required for placing a semiconductor memory device in test mode.

Another advantage of the present invention is that it reduces the risk of damaging a semiconductor memory device during a test operation.

The foregoing and other objects, features and advantages of the invention will become more readily apparent from the following detailed description of a preferred embodiment which proceeds with reference to the drawings.

DETAILED DESCRIPTION OF THE INVENTION

Figure 1:
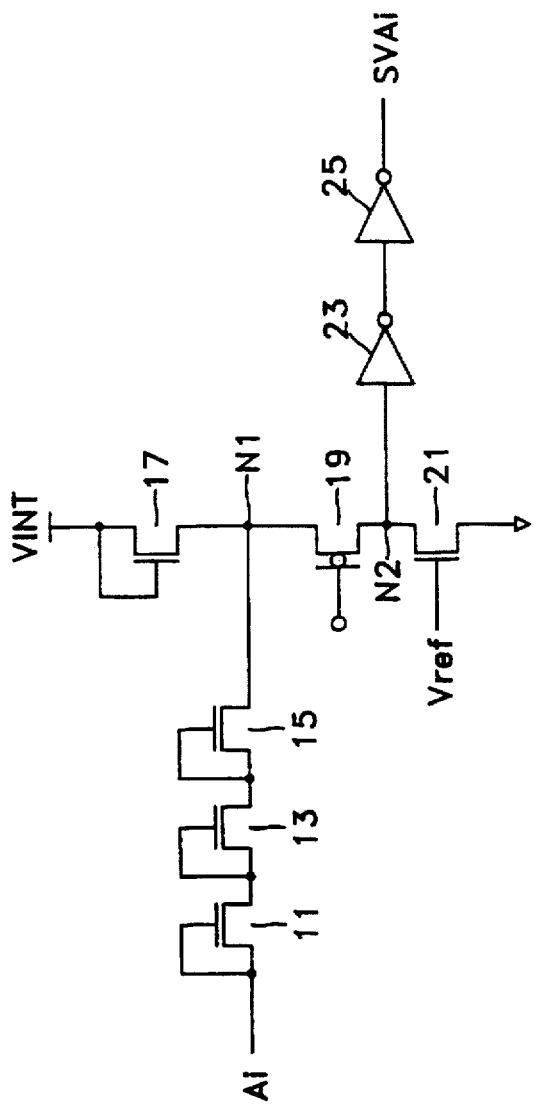
FIG. 1 is a schematic diagram of a prior art overvoltage detection circuit for testing a semiconductor memory device.
Figure 2:
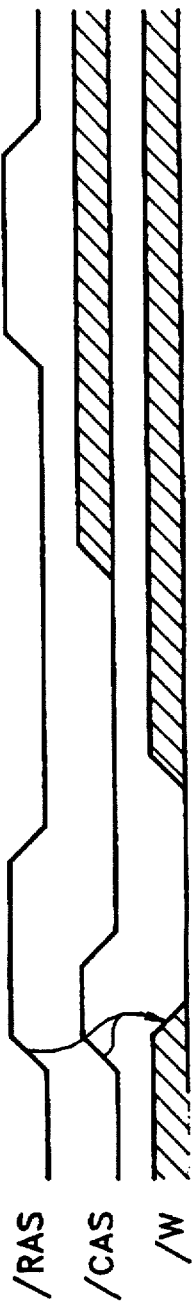
FIG. 2 is a timing diagram showing wave forms of general test signals for testing a semiconductor memory device.
Figure 3:
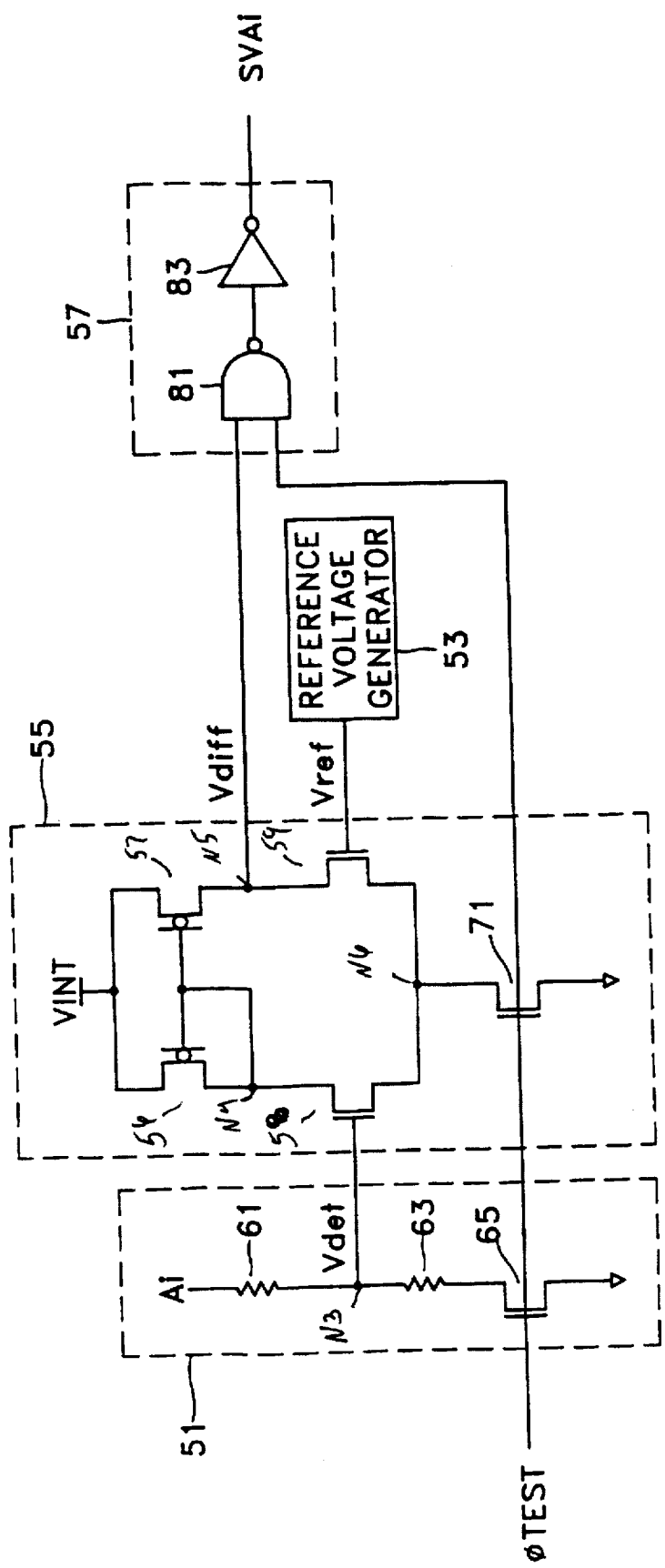
FIG. 3 is a schematic diagram of an embodiment of an overvoltage detection circuit in accordance with the present invention.

Referring to FIG. 3, an overvoltage detection circuit constructed in accordance with the present invention includes a comparison signal generator 51 which generates a comparison voltage signal Vdet in response to a test mode enable signal φ TEST and overvoltage signal Ai. The circuit of FIG. 3 also includes a reference voltage generator 53 which generates a reference voltage signal Vref. A differential amplifier 55 is enabled in response to the test mode enable signal φ TEST and generates a difference voltage signal Vdiff in response to the comparison signal Vdet and the reference voltage signal Vref. A drive stage 57 generates an output signal SVAi in response to the difference signal Vdiff and test mode enable signal φ TEST.

The comparison signal generator 51 includes a first resistor 61 having a first terminal coupled to receive the overvoltage signal Ai and a second terminal connected to a node N3. An NMOS transistor 65 has a source connected to a power supply ground terminal, a drain connected to node N3 through a second resistor 63, and a gate coupled to receive the test mode enable signal φ TEST. Resistors 61 and 63 and transistor 65 form a voltage divider. The comparison voltage signal Vdet is generated at node N3.

Differential amplifier 55 is a general purpose differential amplifier having a pair of PMOS transistors 56 and 57 connected as a current mirror load. Transistor 56 has a source connected to an internal power supply signal VINT, a drain connected to a node N4 and a gate connected back to the drain. Transistor 57 has a source connected to VINT, a drain connected to a node N5, and a gate connected to the gate of transistor 56. The differential amplifier 55 also includes a differential pair of NMOS transistors 58 and 59. Transistor 58 has a drain connected to node N4, a source connected to a node N6, and a gate terminal connected to node N3 of comparison signal generator 51 to receive the comparison signal Vdet. Transistor 59 has a drain connected to node N5, a source connected to node N6, and a gate terminal connected to the reference voltage generator 53 to receive the reference voltage signal Vref. An NMOS transistor 71 has a drain connected to node N6, a source connected to power supply ground, and a gate coupled to receive the test mode enable signal φ TEST. Transistor 71 functions as a current source when the test mode enable signal is enabled. The differential amplifier 55 is powered by the power supply signal VINT. The difference signal Vdiff is generated at node N5.

The drive stage 57 includes a NAND gate 81 which has a first input terminal connected to node N5 to receive the difference signal Vdiff, a second input terminal coupled to receive the test mode enable signal φ TEST, and an output terminal coupled to the input terminal of an inverter 83. The output terminal of inverter 83 generates the output signal SVAi.

Resistors 61 and 63 can be formed by NMOS transistors, PMOS transistors, or polysilicon.

In operation, the signal φ TEST is enabled (switches from 0 to 1) when the write signal /W is enabled after signals /RAS and /CAS. When φ TEST is enabled, NMOS transistors 71 and 65 turn on, thereby energizing the differential amplifier 55 and forming a resistive current path between the signal Ai and ground. When the overvoltage signal Ai is applied, it is divided by the resistive voltage divider formed by resistors 61, 63, and the internal resistance of NMOS transistor 65. The ratio of these resistances determines the value of the comparison signal Vdet with respect to the overvoltage signal Ai.

The comparison signal Vdet is applied to the differential amplifier 55 and compared with reference voltage signal Vref. If Vdet is higher than Vref, Vdiff is driven to a high logic state. If Vdet is less than Vref, Vdiff is driven to a low logic state. Since the signal φ TEST is enabled in test mode, NAND gate 81 is enabled and the output signal SVAi is driven to the same logic state as Vdiff due to the double inverting action of the NAND gate 81 and inverter 83 of drive stage 57.

An advantage of the present invention is that the voltage level of the comparison signal Vdet is determined only by the voltage level of the overvoltage signal Ai and the resistances of resistors 61 and 62 and the internal resistance of transistor 65. Thus, Vdet is not influenced by the signal VINT level of the power supply signal VINT. Accordingly, a constant voltage can always be used for the overvoltage signal Ai regardless of the variations in the power supply voltage. This simplifies the test mode operation of the semiconductor memory device.

Another advantage of the present invention is that the overvoltage signal Ai can be kept at a low enough level to prevent damage to the overvoltage detection circuit, as well as, the rest of the semiconductor device caused by the stress of excessive voltages.

Having described and illustrated the principles of the invention in a preferred embodiment thereof, it should be apparent that the invention can be modified in arrangement and detail without departing from such principles. We claim all modifications and variations coming within the spirit and scope of the following claims.

What is claimed is:

1. An overvoltage, detection circuit for generating a digital logic signal for placing a semiconductor memory device in a parallel test mode, the circuit comprising:
   a comparison signal generator coupled to in address input terminal for generating a comparison signal responsive to an overvoltage signal received on the address input terminal;
   a differential amplifier coupled to the comparison signal generator for comparing the comparison signal to a reference voltage signal, thereby generating a difference signal; and
   a drive stage coupled to the differential amplifier for generating the digital logic signal responsive to the difference signal.

2. A circuit according to claim 1 further including a reference voltage generator coupled to the differential amplifier.

3. A circuit according to claim 1 wherein the comparison signal generator includes a voltage divider coupled to receive the overvoltage signal.

4. A circuit according to claim 3 wherein the voltage divider includes:
   a first resistor having a first terminal coupled to receive the overvoltage signal and a second terminal coupled to a node; and
   a second resistor coupled between the node and a power supply terminal.

5. A circuit according to claim 4 wherein the voltage divider further includes a transistor coupled between the second resistor and the power supply terminal for enabling the voltage divider responsive to a test mode enable signal.

6. A circuit according to claim 1 wherein the differential amplifier includes a differential pair of transistors having a first terminal coupled to receive the comparison signal and a second terminal coupled to receive the reference signal.

7. A circuit according to claim 6 wherein the differential amplifier further includes a transistor coupled between the differential pair of transistors and a power supply terminal for enabling the differential amplifier responsive to a test mode enable signal.

8. A circuit according to claim 1 wherein the drive stage includes a NAND gate having a first input terminal coupled to receive the difference signal and a second input terminal coupled to receive a test mode enable signal.

9. An overvoltage detection circuit for generating a digital logic signal for placing a semiconductor memory device in a parallel test mode, the circuit comprising:
   means for generating a comparison signal responsive to an overvoltage signal received on an address input terminal;
   means for comparing the comparison signal to a reference signal, thereby generating a difference signal; and
   means for generating the digital logic signal responsive to the difference signal.

10. A circuit according to claim 9 further including means for generating the reference signal.

11. A circuit according to claim 9 wherein the means for generating a comparison signal includes means for dividing the overvoltage signal.

12. A circuit according to claim 11 wherein the means for dividing the overvoltage signal includes:
   a first resistor coupled to receive the overvoltage signal; and
   a second resistor coupled in series between the first resistor and a power supply terminal.

13. A method for generating a digital logic signal for placing a semiconductor memory device in a parallel test mode comprising:
   receiving an overvoltage signal on an address input terminal;
   generating a comparison signal responsive to the overvoltage signal;
   comparing the comparison signal to a reference signal, thereby generating a difference signal; and
   generating an output signal responsive to the difference signal.

14. A method according to claim 13 wherein generating the comparison signal includes dividing the overvoltage signal.

15. A method according to claim 13 wherein comparing the comparison signal to a reference signal includes coupling the comparison signal and the reference signal to a differential amplifier.

16. A method according to claim 13 wherein generating the comparison signal includes generating the comparison signal responsive to an enable signal.

17. A method according to claim 13 wherein comparing the comparison signal to a reference signal includes comparing the comparison signal to a reference signal responsive to an enable signal.

* * * * *